United States Patent
Yamada et al.

(10) Patent No.: US 7,276,769 B2
(45) Date of Patent: Oct. 2, 2007

(54) SEMICONDUCTOR INTEGRATED CIRCUIT DEVICE

(75) Inventors: Masaru Yamada, Niigata (JP); Yasutoshi Okuno, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 30 days.

(21) Appl. No.: 10/817,861

(22) Filed: Apr. 6, 2004

(65) Prior Publication Data

US 2004/0238900 A1     Dec. 2, 2004

(30) Foreign Application Priority Data

May 29, 2003   (JP)   .............................. 2003-152180

(51) Int. Cl.
*H01L 29/72*   (2006.01)
(52) U.S. Cl. ................ 257/401; 257/390; 257/510; 257/544
(58) Field of Classification Search ............... 257/230, 257/301, 401, 370, 510, 544
See application file for complete search history.

(56) References Cited

U.S. PATENT DOCUMENTS

2002/0047138 A1\*   4/2002   Watanabe et al. ........... 257/230
2003/0127697 A1\*   7/2003   Ohta et al. ................... 257/390
2003/0132473 A1\*   7/2003   Kumagai et al. ............ 257/301
2004/0152243 A1\*   8/2004   Kuroda et al. .............. 438/129

FOREIGN PATENT DOCUMENTS

JP   P2001-332706 A   11/2001
JP   P2002-368080 A   12/2002

\* cited by examiner

*Primary Examiner*—Edward Wojciechowicz
(74) *Attorney, Agent, or Firm*—McDermott Will & Emery LLP

(57) ABSTRACT

In a semiconductor integrated circuit device, semiconductor elements formed in active regions included in a first element formation portion (stress transition region) in a peripheral circuit formation portion are not electrically driven, while only semiconductor elements of a second element formation portion (steady stress region) are electrically driven. Therefore, the second element formation portion in the peripheral circuit formation portion is located away from an outer STI region so as to be hardly affected by compressive stress.

10 Claims, 12 Drawing Sheets

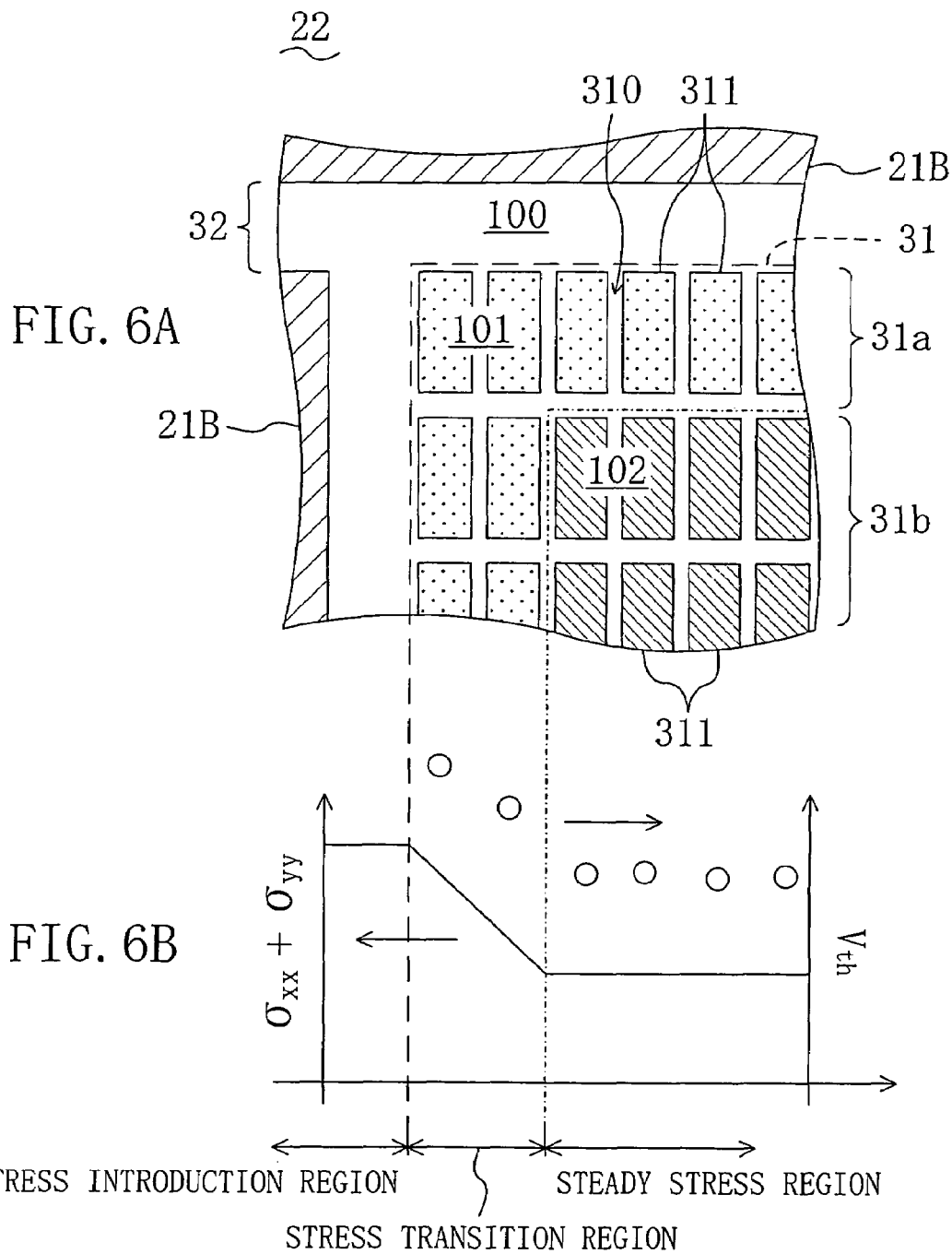

STRESS INTRODUCTION REGION | STRESS TRANSITION REGION | STEADY STRESS REGION

SEMICONDUCTOR INTEGRATED CIRCUIT DEVICE

BACKGROUND OF THE INVENTION (1) Field of the Invention

The present invention relates to a semiconductor integrated circuit device (Large-Scale Integration (LSI)), and more particularly relates to a semiconductor integrated circuit device for preventing or suppressing a change in electrical performance of a device, such as a transistor, resulting from stress caused by the isolation region to active region of the device.

(2) Description of Related Art

A known semiconductor integrated circuit device will be described with reference to FIG. 12 (for example, see Japanese Unexamined Patent Publication No. 2001-332706).

As shown in FIGS. 12A and 12B, in a dynamic random access memory (DRAM) device formed on a semiconductor substrate 200 made of silicon, p-channel and n-channel transistor regions 211 and 212 forming a sense amplifier are placed apart from each other between a memory cell array 210 and a peripheral circuit 213. Further, a plurality of stress interference blocking patterns 215 for preventing stress interference are formed between the memory cell array 210 and the p-channel transistor region 211, between the p-channel transistor region 211 and the n-channel transistor region 212, and between the n-channel transistor region 212 and the peripheral circuit 213, respectively. Each stress interference blocking pattern 215 is interposed between each two of isolation (Shallow Trench Isolation: STI) regions 201 extending parallel to each other.

The stress interference blocking patterns 215, which form dummy active regions, reduce a difference in stress resulting from the isolation region 201, for example, between the active regions of the p-channel and n-channel transistor regions 211 and 212. This can suppress deterioration in sensitivity of the sense amplifier caused by the difference in threshold voltage ($V_{th}$) between the p-channel and n-channel transistors.

However, the known semiconductor integrated circuit device is merely for reducing stress interference in a particular element pattern limited to the active regions of differentially operating transistors such as p-channel and n-channel transistors.

In recent years, semiconductor integrated circuit devices are becoming finer so that their structures are becoming more complicated. Under these circumstances, a difference in stress is produced between the end of an active region forming a device such as a transistor and the central part of the active region. Thus, a change in transistor electrical performance resulting from this stress difference is becoming unignorable. Changes in transistor electrical performance due to stress include, for example, fluctuations in threshold voltage and driving current. Such changes in characteristics increase 1/f noise in an integrated circuit or often induce the phenomenon that the margin of the driving timing decreases.

SUMMARY OF THE INVENTION

The present invention is made to solve the conventional problems, and its object is to reduce the difference in stress between the end and central part of the active region of a device, such as a transistor, to reduce and further prevent the change in device electrical performance resulting from the difference in stress produced between the end and central part thereof.

In order to accomplish the above object, the present inventors paid attention to, as a cause of the difference in electrical characteristics among transistors in a plurality of device regions (active regions), i.e., regions in which a device is to be formed, forming a semiconductor integrated circuit device, stress applied to the active regions from an isolation region that partitions the active regions from one another. As a result, the present invention takes the following four solutions:

(1) out of a plurality of active regions forming devices, those adjacent to an isolation region placed around the plurality of active regions are not electrically driven;

(2) a first isolation region that partitions the active regions from one another and a second isolation region placed around the plurality of active regions have the same width;

(3) the design dimensions (plane dimensions) of each of dummy active regions placed in the isolation region located around the plurality of active regions are matched with the design dimensions of the adjacent active region; and (4) the design dimensions (plane dimensions) of each of the dummy active regions placed in the isolation region located around the plurality of active regions are matched with the design dimensions of the corresponding active region located inside the periphery (ends) of the active regions.

Specifically, a first semiconductor integrated circuit device of the present invention may comprise: a plurality of active regions arranged so as to be partitioned from one another by a first isolation region; and a second isolation region formed around the plurality of active regions and having a larger width than the first isolation region, wherein some of the plurality of active regions constitute a first element formation portion adjacent to the second isolation region and the others constitute a second element formation portion located inside the first element formation portion, and only elements included in the second element formation portion are electrically driven.

According to the first semiconductor integrated circuit device, the plurality of active regions are sectioned into the first element formation portion adjacent to the second isolation region and the second element formation portion located inside thereof, and only elements included in the second element formation portion located inside the first element formation portion are electrically driven. In this case, since the second element formation portion is located away from the second isolation region formed around the plurality of active regions and having a width larger than the first isolation region, the elements included in the second formation portion are hardly affected by stress resulting from the second isolation region. As a result, no difference in electrical performance is produced among the elements included in the second element formation region.

In the first semiconductor integrated circuit device, it is preferable that the first element formation portion is a stress transition region in which stress resulting from a material constituting the second isolation region is shifted depending on the distance between the first element formation portion and the second isolation region and the second element formation portion is a steady stress region in which stress resulting from a material constituting the second isolation region is not shifted depending on the distance between the second element formation portion and the second isolation region. As will be described later, the present inventors have obtained the following findings: the compressive stress applied from an isolation region to each of the active regions increases in proportion to the width of each of the isolation region; and the compressive stress applied from an isolation region to each of the active regions is inversely proportional to the distance from the isolation region. Therefore, if the second element formation portion located away from the second isolation region becomes the steady stress region that is hardly affected by stress resulting from a material constituting the second element isolation region, electrical performance of the elements in the second element formation portion can be surely stabilized.

A second semiconductor integrated circuit device of the present invention may comprise: a plurality of active regions arranged so as to be partitioned from one another by a first isolation region; and a second isolation region formed around the plurality of active regions and having the same width as that of the first isolation region.

It is seen from the above-mentioned first finding that reduction in width of each of the element isolation regions leads to reduced stress applied to each of the active regions. Therefore, according to the second semiconductor integrated circuit device, differences in electrical performance among the elements included in the plurality of active regions can be reduced.

In the second semiconductor integrated circuit device, the first and second isolation regions are preferably formed to have the minimum dimension of the design rule.

The second semiconductor integrated circuit device may further comprise dummy active regions formed on the opposite side of the second isolation region to the plurality of active regions, wherein the ratio of total area of element patterns in the dummy active regions to unit area is preferably identical with that of total area of element patterns in the active regions to unit area.

A third semiconductor integrated circuit device of the present invention may comprise: a plurality of active regions arranged so as to be partitioned from one another by a first isolation region; and dummy active regions formed around the plurality of active regions with a second isolation region interposed therebetween, wherein some of the plurality of active regions constitute a first element formation portion adjacent to the second isolation region and the others constitute a second element formation portion located inside the first element formation portion, and the dummy active regions are formed to have the same plane dimensions as the adjacent active regions included in the first element formation portion.

According to the third semiconductor integrated circuit device, stress applied from the second isolation region is equally applied to the dummy active regions and the active regions included in the first element formation portion. Therefore, the elements included in the active regions of the first element formation portion adjacent to the second isolation region also have stabilized electrical performance.

In the third semiconductor integrated circuit device, it is preferable that the plurality of active regions include at least two kinds of active regions of different planar shapes and said at least two kinds of active regions of different planar shapes are placed one after another in a predetermined cycle.

A fourth semiconductor integrated circuit device of the present invention may comprise: a plurality of active regions arranged so as to be partitioned from one another by a first isolation region; and dummy active regions formed around the plurality of active regions with a second isolation region interposed therebetween, wherein the plurality of active regions include at least two kinds of active regions of different planar shapes, said at least two kinds of active regions of different planar shapes are placed one after another in a predetermined cycle, and some of the plurality of active regions constitute a first element formation portion adjacent to the second isolation region and the others constitute a second element formation portion located inside the first element formation portion; and the dummy active regions are formed to have the same plane dimensions as the corresponding active regions included in the second element formation region and adjacent to the first element formation portion.

According to the fourth semiconductor integrated circuit device, when the plurality of active regions include at least two kinds of active regions of different planar shapes and said at least two kinds of active regions of different planar shapes are arranged one after another in a given cycle, assuming that an element pattern of an active region included in the first element formation portion is pattern b and an element pattern of an active region included in the second element formation portion and adjacent to the first element formation portion is pattern a, an element pattern of a dummy active region is pattern a. Therefore, the active regions including the dummy active regions are placed inwardly in the order of pattern a, pattern b, pattern a, . . . , whereby stress applied from the second isolation region is equally applied to the dummy active regions and the active regions included in the first element formation portion. As a result, the elements included in the active regions of the first element formation portion adjacent to the second isolation region have further stabilized electrical performance.

In the third or fourth semiconductor integrated circuit device, the first and second isolation regions are preferably formed to have the same width.

In the third or fourth semiconductor integrated circuit device, the first and second isolation regions are preferably formed to have the minimum dimension of a design rule.

BRIEF DESCRIPTION OF THE DRAWINGS

FIGS. 1A and 1B show a semiconductor integrated circuit device according to a first embodiment of the present invention, wherein FIG. 1A is a schematic plan view thereof and FIG. 1B is a partial enlarged plan view thereof.

FIG. 6A is an enlarged plan view showing a portion of a known semiconductor integrated circuit device including active regions and dummy active regions for the purpose of explaining the concept of the present invention.

FIG. 6B is a graph showing stress values and threshold voltages of transistors in the region of the semiconductor integrated circuit device corresponding to that shown in FIG. 6A.

FIGS. 12A and 12B show a known semiconductor integrated circuit device, wherein FIG. 12A is a partial plan view thereof and FIG. 12B is a cross sectional view taken along the line XIIb-XIIb shown in FIG. 12A.

DETAILED DESCRIPTION OF THE INVENTION

EMBODIMENT 1

A first embodiment of the present invention will be described with reference to the drawings.

Figure 1A:
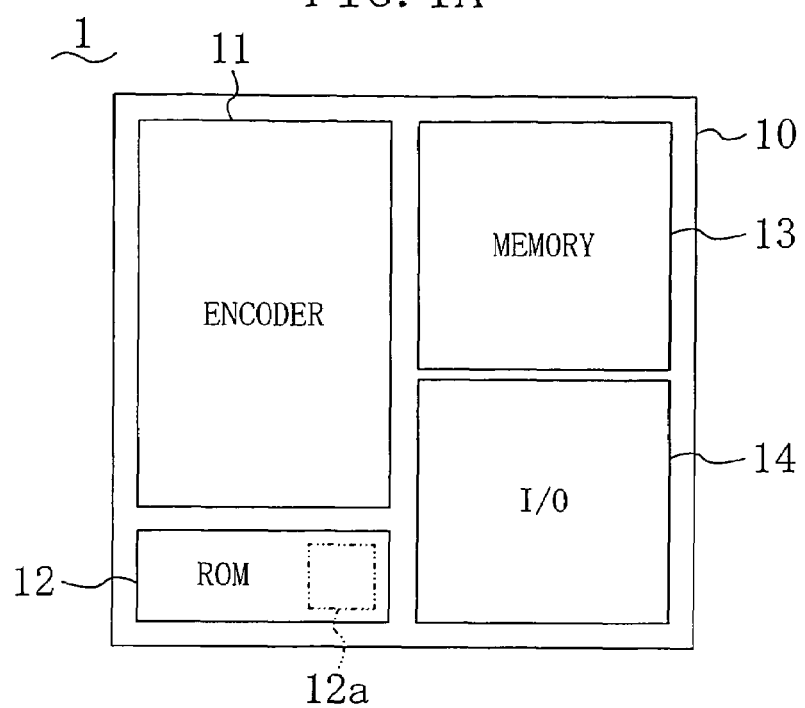

FIG. 1A schematically shows the planar configuration of a semiconductor integrated circuit device according to a first embodiment of the present invention.

As shown in FIG. 1A, a semiconductor integrated circuit device 1 of the first embodiment is, for example, formed on a semiconductor substrate 10 made of silicon and comprises: an encoder 11 having an MPEG (Motion Picture Experts Group) encoding function; a ROM (Read Only Memory) 12 having a ROM function; a memory 13; and an I/O (input/output) unit 14 having the function of inputting/outputting signals from/to external devices.

Figure 1B:
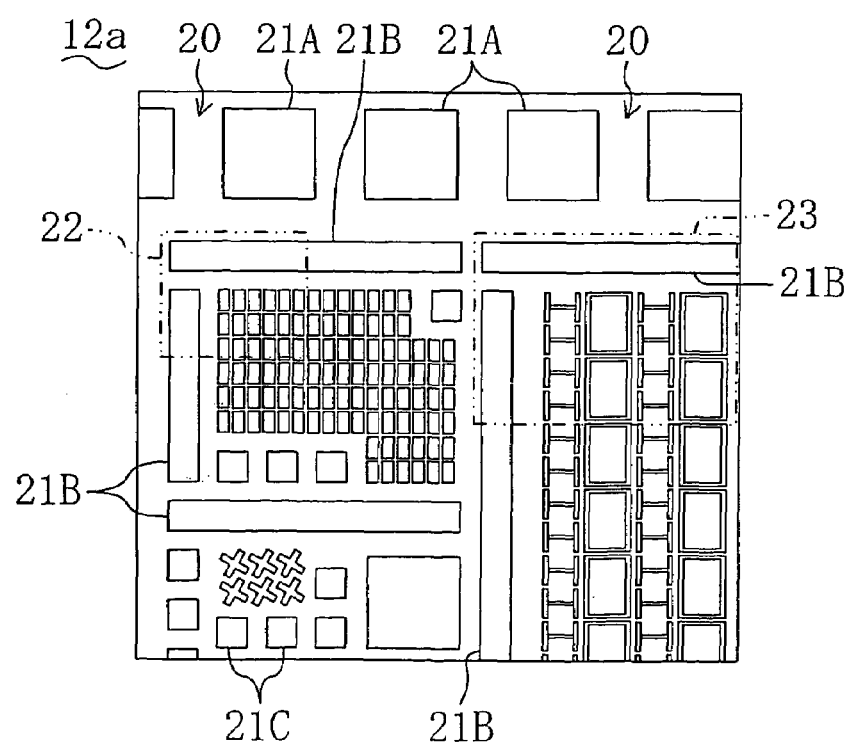

FIG. 1B is an enlarged illustration of an arbitrary region 12a of the ROM 12 shown in FIG. 1A. As shown in FIG. 1B, the region 12a is formed with a plurality of dummy active regions 21A, 21B and 21C that are partitioned from one another by an isolation (Shallow Trench Isolation: STI) region 20. The dummy active regions 21A, 21B and 21C are automatically generated, in the process step of planarizing the substrate surface after the formation of the STI region 20 using a chemical mechanical polishing (CMP) method, based on the rules described in the design manual such that no step heights are formed on the substrate surface due to density differences in a design pattern. In this relation, a first region denoted by 22 represents the corner of a peripheral circuit including dummy active regions 21B, while a second region denoted by 23 represents the corner of a static random access memory (SRAM) circuit including dummy active regions 21B.

Figure 2:
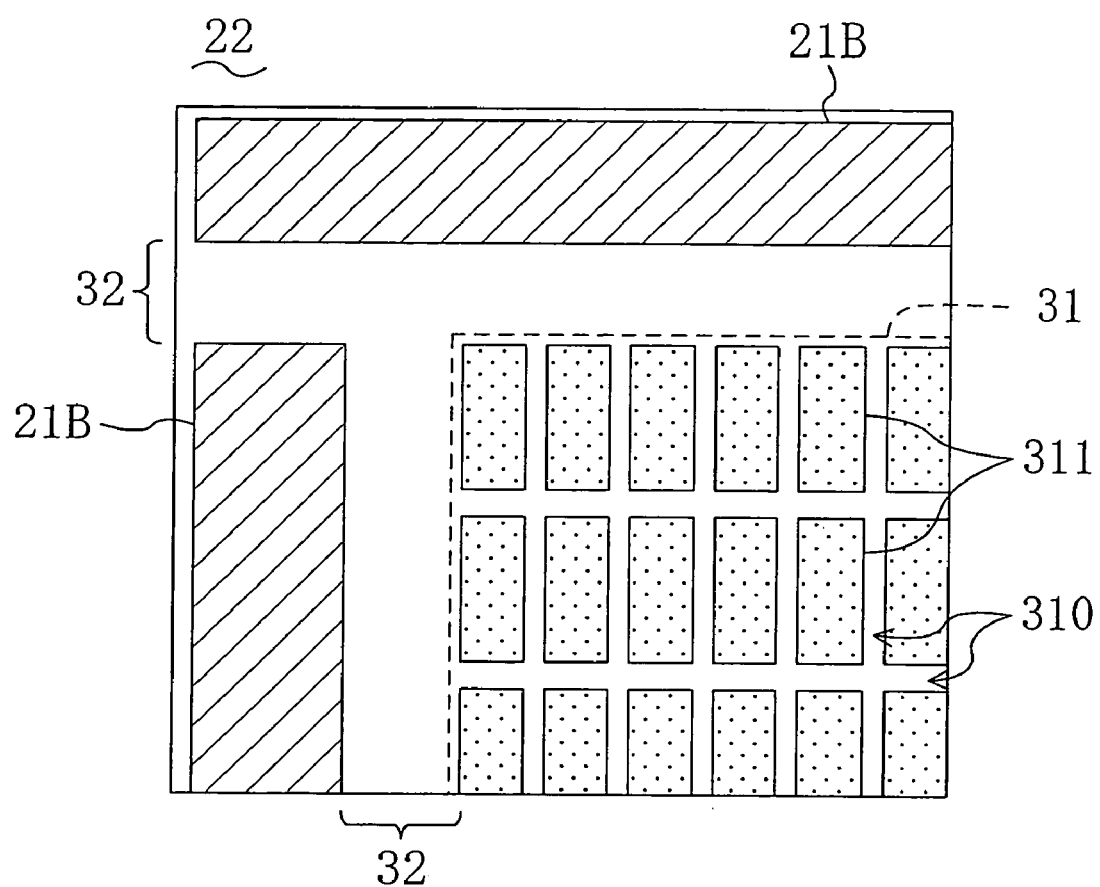
FIG. 2 is an enlarged plan view showing part of the semiconductor integrated circuit device shown in FIG. 1B.

FIG. 2 is an enlarged illustration of the first region 22 shown in FIG. 1B. As shown in FIG. 2, a peripheral circuit formation portion 31 in which a peripheral circuit is formed is placed inside the dummy active regions 21B and formed with a plurality of active regions 311 placed so as to be partitioned from one another by an inner STI region 310.

An outer STI region 32 having a width larger than the inner STI region 310 is formed between the dummy active regions 21B and the peripheral circuit formation region 31.

For example, a cause of a change in electrical performance of a transistor formed in each active region 311 in the peripheral circuit formation portion 31 is considered to be the influence of stresses applied from the inner STI region 310 and the outer STI region 32 to the active region 311. Stresses applied from the inner STI region 310 and the outer STI region 32 to the active region change depending on the widths of the STI regions 310 and 32, the pattern shape of the active region 311 and the process conditions. In the first embodiment, a change in stress due to the process conditions is not considered but attention is focused on the widths of the STI regions 310 and 32 and the pattern shape of the active region 311.

With reference to the drawings, a description will be given below of s result obtained by evaluating the dependence of stress applied from an STI region to an active region on the STI width.

Figure 3:
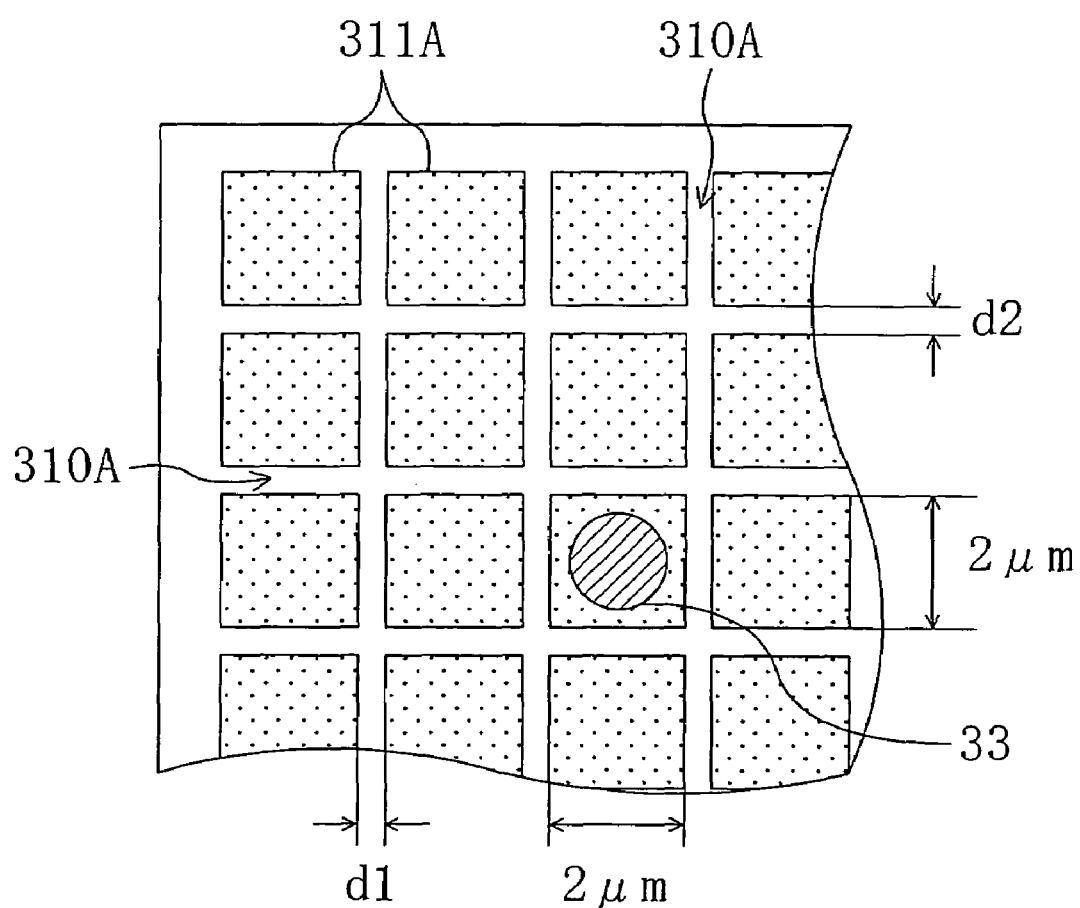
FIG. 3 is a partial enlarged plan view of an active region pattern for explaining a finding of the present invention.

FIG. 3 shows active regions 311A for evaluation, which are evaluated by setting the plane dimensions of each active region 311A at 2 μm×2 μm and each of the widths d1 and d2 of an STI region 310A surrounding the active region 311A at 0.2 μm, 0.5 μm, 1.0 μm, 2.0 μm, or 5.0 μm. In this case, reference numeral 33 denotes the area of a certain active region 311A to be analyzed, which is radiated with a laser.

Figure 4:
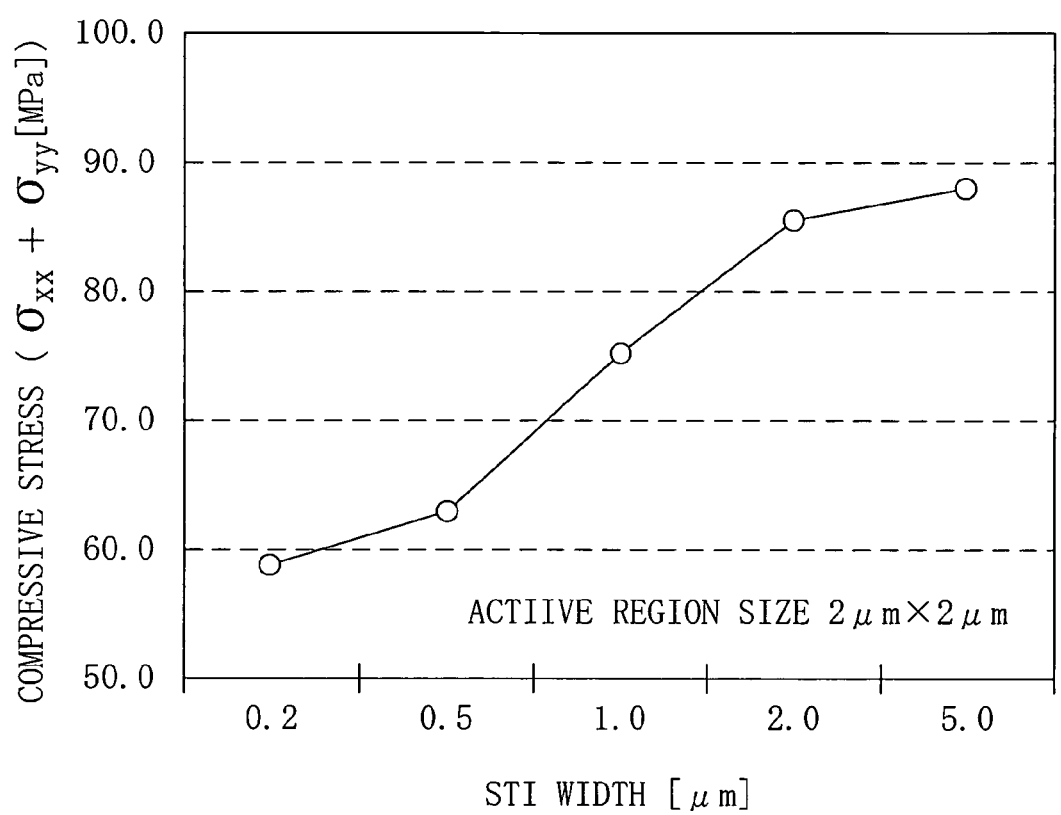
FIG. 4 is a graph showing a result obtained by evaluating the active region pattern shown in FIG. 3, which represent the dependence of stress resulting from an isolation region on the width.

FIG. 4 shows a result obtained by evaluating stress applied to the center of the active region 311A using Raman spectroscopy. It is seen from FIG. 4 that compressive stress applied to the active region 311A increases in proportion to the set width of the STI region 310A.

A method for evaluating stress will be described hereinafter.

Raman spectroscopy was used for evaluation of stress, a YAG (yttrium-aluminum-garnet) laser with a wavelength of 532 nm was used for a light source for irradiation, and a lens with a magnification of 150× was used to focus the laser on the center of a certain active region 311A.

The strain amount of a silicon (Si) crystal used for a substrate was calculated from the peak shift thereof. For this purpose, a Raman peak of Bare-Si was used as a reference for the Si peaks. A spectroscope adopted a backscattering arrangement, and a laser was radiated from the [100] direction of the zone axis of silicon.

Figure 5A:
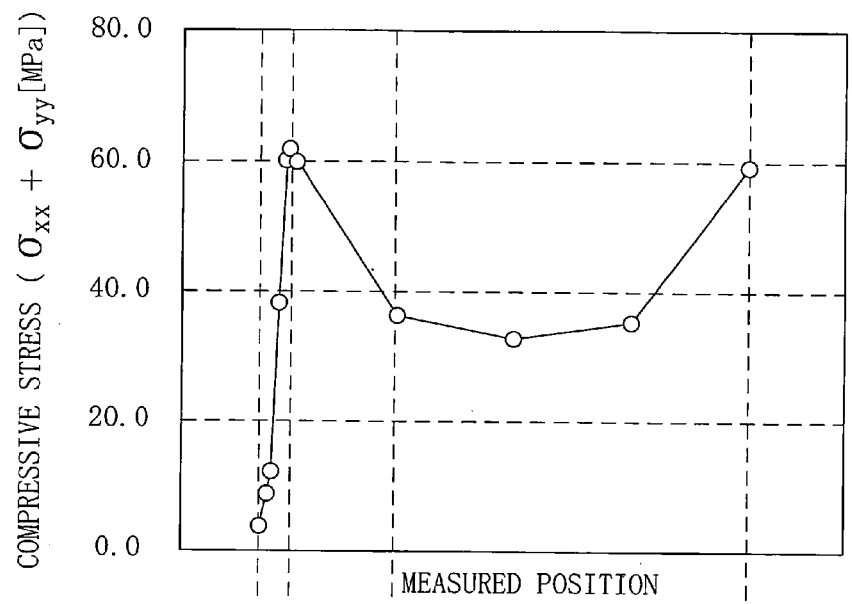
FIG. 5A is a graph for explaining another finding of the present invention, which shows the dependence of stress resulting from the isolation region on positions.
Figure 5B:
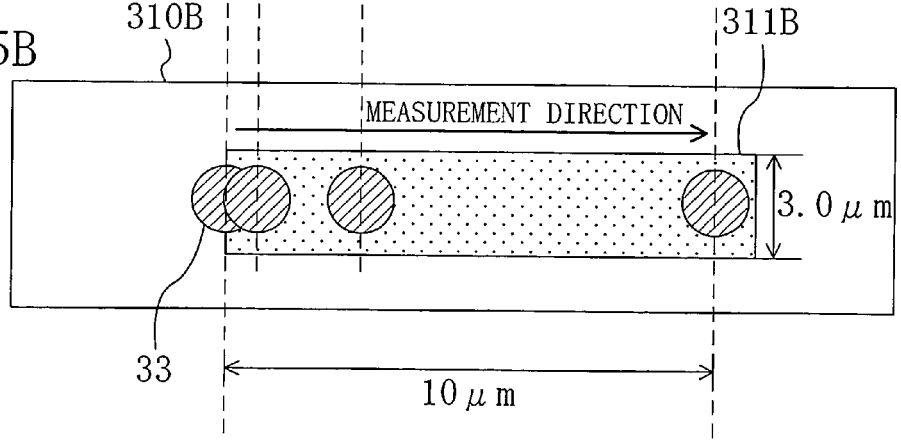
FIG. 5B is a plan view showing an active region pattern for evaluation.

FIG. 5A shows a result obtained by an evaluation on the range of the active region 311B in which compressive stress from an STI region 310B to the active region 311B causes a stress gradient. In this case, as shown in FIG. 5B, the active region 311B was of a rectangular planar shape with a length of 10 μm and a width of 3.0 μm, and was measured for stress at some points in the lengthwise direction from its one end bordering on the STI region 310B toward its center, by using Raman spectroscopy. As seen from FIG. 5A, the compressive stress applied from the STI region 310B to the active region 311B has peaks at both ends of the active region 311B and decreases to be approximately constant as the measured point becomes closer to the center of the active region 311B.

In FIG. 5A, the position of the active region 311B where the compressive stress becomes maximum is located approximately 0.51 μm inward from the border between the active region 311B and the STI region 310B. However, it has actually been recognized, using other simulation methods or a transmission electron microscopy electron diffraction method (TEM-ED method) in which the strain amount of a crystal lattice is calculated utilizing transmission electron diffraction and the calculated strain amount of the lattice is calculated in terms of stress, that as the measured point becomes closer to the STI region 310B, the compressive stress becomes larger.

Typically, a micro-Raman spectroscope measures stress by summing up spectra collected from the whole analyzed area 33 of the active region 311B. Thus, it is considered that the compressive stress seemingly becomes low in the border between the active region 311B and the STI region 310B because tensile stress produced at the bottom of part of the STI region 310B within the analyzed area 33 and the compressive stress produced in the active region 311B cancel out each other.

The present inventors have obtained the two following findings from the results of stress evaluation shown in FIGS. 4 and 5:

(1) the compressive stress applied from an STI region to an active region increases in proportion to the width of the STI region; and (2) the compressive stress applied from an STI region to an active region is inversely proportional to the distance from the STI region.

Based on the evaluation results shown in FIGS. 4 and 5, the present inventors introduce a new concept for simplicity of the following description.

FIG. 6A shows the introduced concept using the circuit arrangement shown in FIG. 2 as an example and FIG. 6B shows the stress values of active regions 311 within a first region 22 of a peripheral circuit portion and the threshold voltage ($V_{th}$) of n-channel transistors formed in the active regions 311. In this case, the axis of ordinates in FIG. 6B represents compressive stress ($\sigma_{xx}+\sigma_{yy}$) and the upward direction represents the positive direction of the compressive stress.

FIG. 6A is equivalent to an exemplary arrangement of the known semiconductor integrated circuit device. When the width of an inner STI region 310 provided among the active regions 311 of the peripheral circuit portion is compared with the width of an outer STI region 32 provided between each of the dummy active regions 21B and the peripheral circuit formation portion 31, the width of the outer STI region 32 is greatly larger than that of the inner STI region 310.

For example, conventionally, the outer STI region 32 has had a width of approximately several micrometer, and an outer STI region 32 with a so-called submicron size of 1 μm or less has not been formed between each of the dummy active regions 21B and the peripheral circuit formation portion 31.

In this relation, as shown in FIGS. 6A and 6B, the outer STI region 32 can be considered to be the primary area of the semiconductor integrated circuit device from which stress is applied to the active regions 311 formed in the peripheral circuit formation portion 31, based on the above-mentioned relationship between the width of the STI region and the stress applied to the active region. Hereinafter, this area is referred to as a stress introduction region 100.

Next, since the stress applied from the outer STI region 32 to each active region 311 is inversely proportional to the distance therebetween, a stress gradient occurs from the edge of the stress introduction region 100 adjacent to a first element formation portion 31a of the peripheral circuit formation portion 31 across the first element formation portion 31a. This area in which the stress gradient occurs is hereinafter referred to as a stress transition region 101.

Furthermore, the area of the peripheral circuit formation portion 31 other than the first element formation portion 31a, i.e., a second element formation portion 31b located inside the first element formation portion 31a is unaffected by the stress from the outer STI region 32. This area is hereinafter referred to as a steady stress region 102.

Figure 7A:
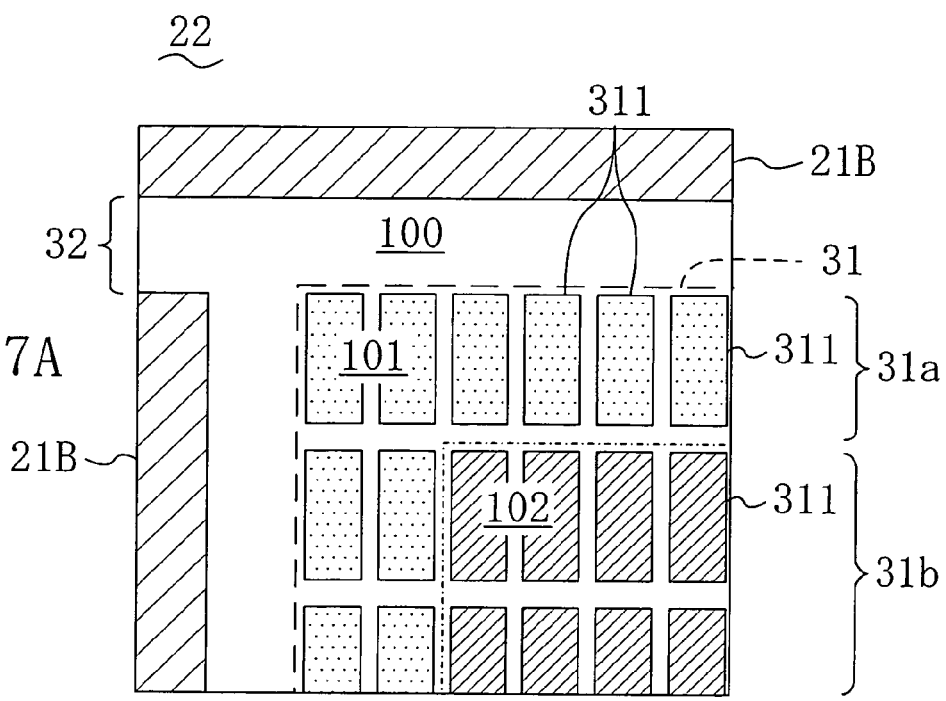
FIG. 7A is an enlarged plan view showing a portion of the semiconductor integrated circuit device according to the first embodiment of the present invention including active regions and dummy active regions.
Figure 7B:
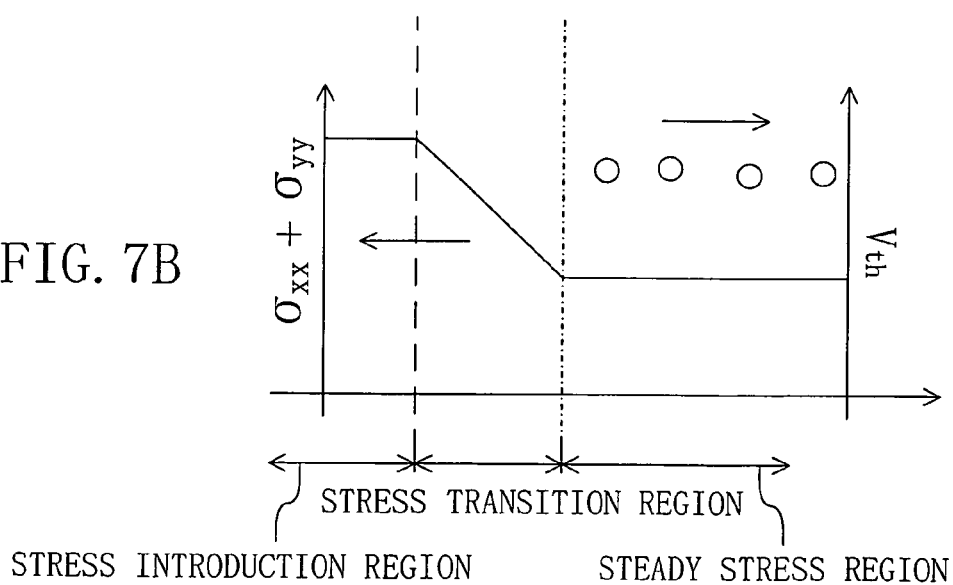
FIG. 7B is a graph showing stress values and threshold voltages of transistors in the region of the semiconductor integrated circuit device corresponding to that shown in FIG. 7A.

FIG. 7A shows the planar configuration of a corner of the peripheral circuit portion in a semiconductor integrated circuit device according to the first embodiment of the present invention, and FIG. 7B shows the changes in the stress values of the active regions shown in FIG. 7A and the changes in the threshold voltages of transistors formed in the active regions receiving the stress. In FIG. 7A, the same reference numerals are given to the same components as those shown in FIG. 6A.

As described above, in the known semiconductor integrated circuit device, semiconductor elements within a first element formation portion 31a of a peripheral circuit formation portion 31 adjacent to an outer STI region 32, i.e., semiconductor elements within a stress transition region 101, are also electrically driven. Therefore, as a matter of course, a circuit is formed to operate active regions 311 including those having differences in electrical performance among the elements due to stress applied from the stress introduction region 100.

However, with the progress of miniaturization, local changes in characteristics or increase of noise resulting from stress differences among the elements in the integrated circuit decrease the margin of the circuit operation, which is a factor that makes the yield worse.

To cope with this, in the first embodiment, the semiconductor elements formed in the active regions 311 within the first element formation portion 31a (stress transition region 101) of the peripheral circuit formation portion 31 are not electrically driven, while only the semiconductor elements within the second element formation portion 31b (steady stress region 102) are electrically driven. In this manner, as shown in FIG. 7B, a semiconductor integrated circuit can be implemented that is unaffected by compressive stress from the outer STI region 32.

As a result of various studies, the present inventors have obtained the finding that the active regions 311 located approximately 1.01 μm inwardly from the outer STI region 32 are hardly affected by stress from the outer STI region 32. In this case, it is desirable that the elements within the stress transition region 101 which are not electrically driven have the same structure as those within the steady stress region 102, e.g., the same gate electrode structure. The reason for this is as follows. It is considered that the stress applied to each active region 311 depends not only upon the outer STI region 32 but also upon the sizes or layouts of a gate electrode, a contact and the like included in the active region. Therefore, if the elements within the stress transition region 101 have the same structure as those within the steady stress region 102, the stress difference produced between the stress transition region 101 and the steady stress region 102 can also be reduced to a minimum.

EMBODIMENT 2

A second embodiment of the present invention will be described hereinafter with reference to the drawings.

Figures 8A, 8B:
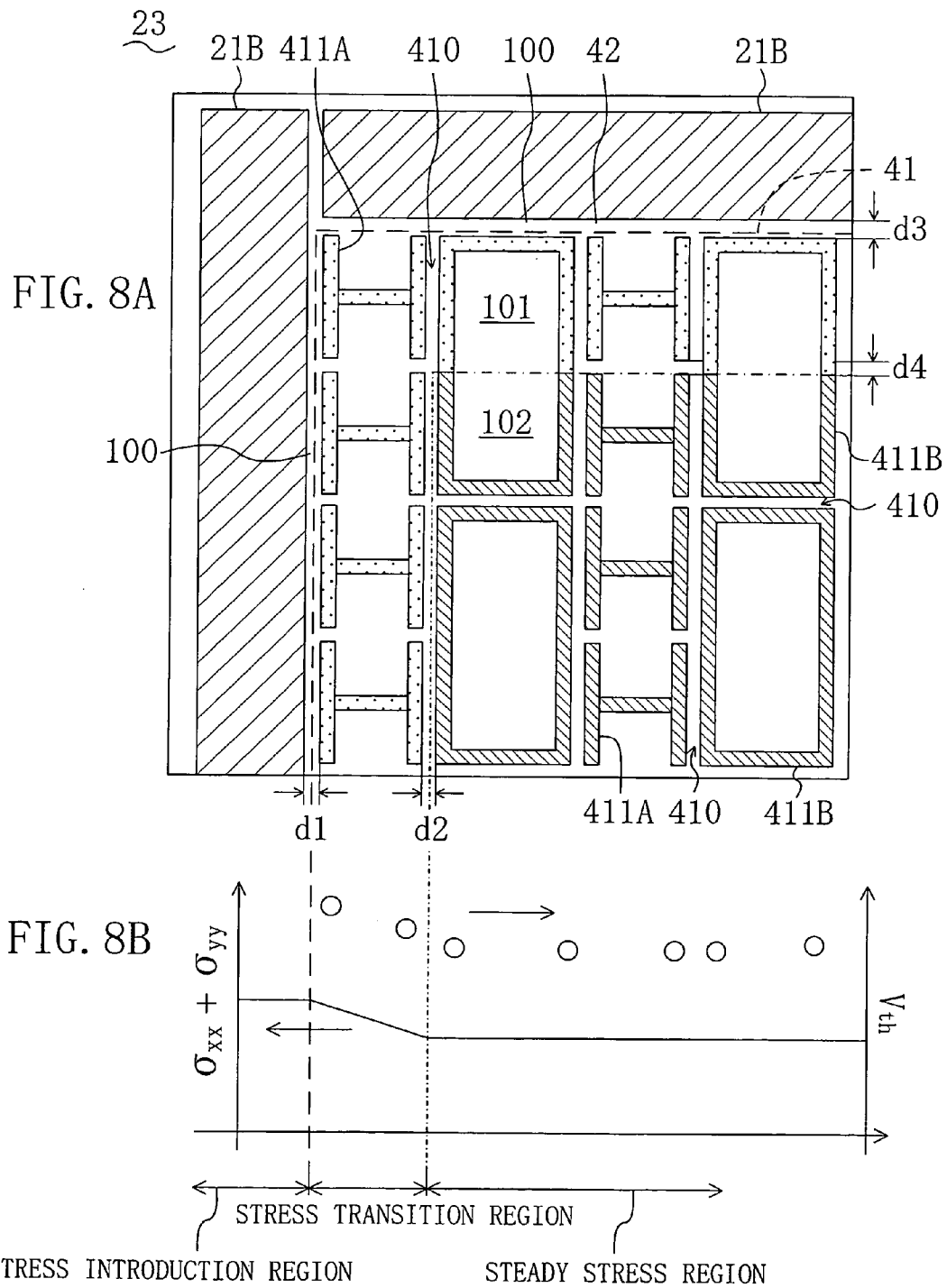
FIG. 8A is an enlarged plan view showing a portion of a semiconductor integrated circuit device according to a second embodiment of the present invention including active regions and dummy active regions.
FIG. 8B is a graph showing stress values and threshold voltages of transistors in the region of the semiconductor integrated circuit device corresponding to that shown in FIG. 8A.

FIG. 8A shows the planar configuration of a corner of an SRAM circuit in a semiconductor integrated circuit device according to a second embodiment of the present invention, and FIG. 8B shows the changes in the stress values of the active regions shown in FIG. 8A and the changes in the threshold voltages of transistors formed in the active regions receiving the stress. In FIG. 8A, the same reference numerals are given to the same components as those shown in FIG. 7A.

FIG. 8A is an enlarged illustration of the second region 23 shown in FIG. 1B and shows a corner of an SRAM circuit.

As shown in FIG. 8A, the semiconductor integrated circuit device of the second embodiment comprises dummy active regions 21B and an SRAM circuit formation portion 41 placed inside the dummy active regions 21B. In the SRAM circuit formation portion 41, a plurality of active regions 411A and 411B of two types are alternately formed in the x direction so as to be partitioned from one another by an inner STI region 410.

The second embodiment is characterized in that an outer STI region 42 and the inner STI region 410 are arranged such that their respective widths d1 and d2 along the x direction are substantially the same and their respective widths d3 and d4 along the y direction are also substantially the same. In this case, the minimum value defined by a rule described in the design manual may be used as each of the widths d1, d2, d3, and d4.

As seen from the above, the second embodiment is an invention obtained from the above-mentioned first finding. Hence, compressive stress applied from a stress introduction region 100 to a stress transition region 101 is reduced. This reduces the difference between stress applied to each of the active regions 411A and 411B within a stress transition region 101 and stress applied to each of the active regions 411A and 411B within a steady stress region 102.

Therefore, the width of the outer STI region 42 serving as the stress introduction region 100 is not set at a dimension for improving flatness in a CMP process but is set to reduce the stress difference between the stress transition region 101 and the steady stress region 102 at the end of the SRAM circuit formation portion 41. In this manner, the difference in stress applied to each active region 411A or 411B between the stress transition region 101 and the steady stress region 102 is reduced. As a result, the difference in electrical performance of a semiconductor element formed in each active region 411A or 411B between the stress transition region 101 and the steady stress region 102 can be suppressed.

On the other hand, in the known semiconductor integrated circuit device, when a fabrication process with a design rule of 0.13 μm is given as an example, the width of the inner STI region of the SRAM circuit is about 0.2 μm and the width of the outer STI region is at least about 1 μm. Since compressive stress applied to each active region becomes larger in proportion to the width of the STI region, the stress transition region is different in the value of stress applied to each active region from the steady stress region. As a result, a difference in electrical performance is produced between each semiconductor element formed in the stress transition region and each semiconductor element formed in the steady stress region.

Modification of Embodiment 2

A modification of the second embodiment of the present invention will be described hereinafter with reference to the drawings.

Figures 9A, 9B:
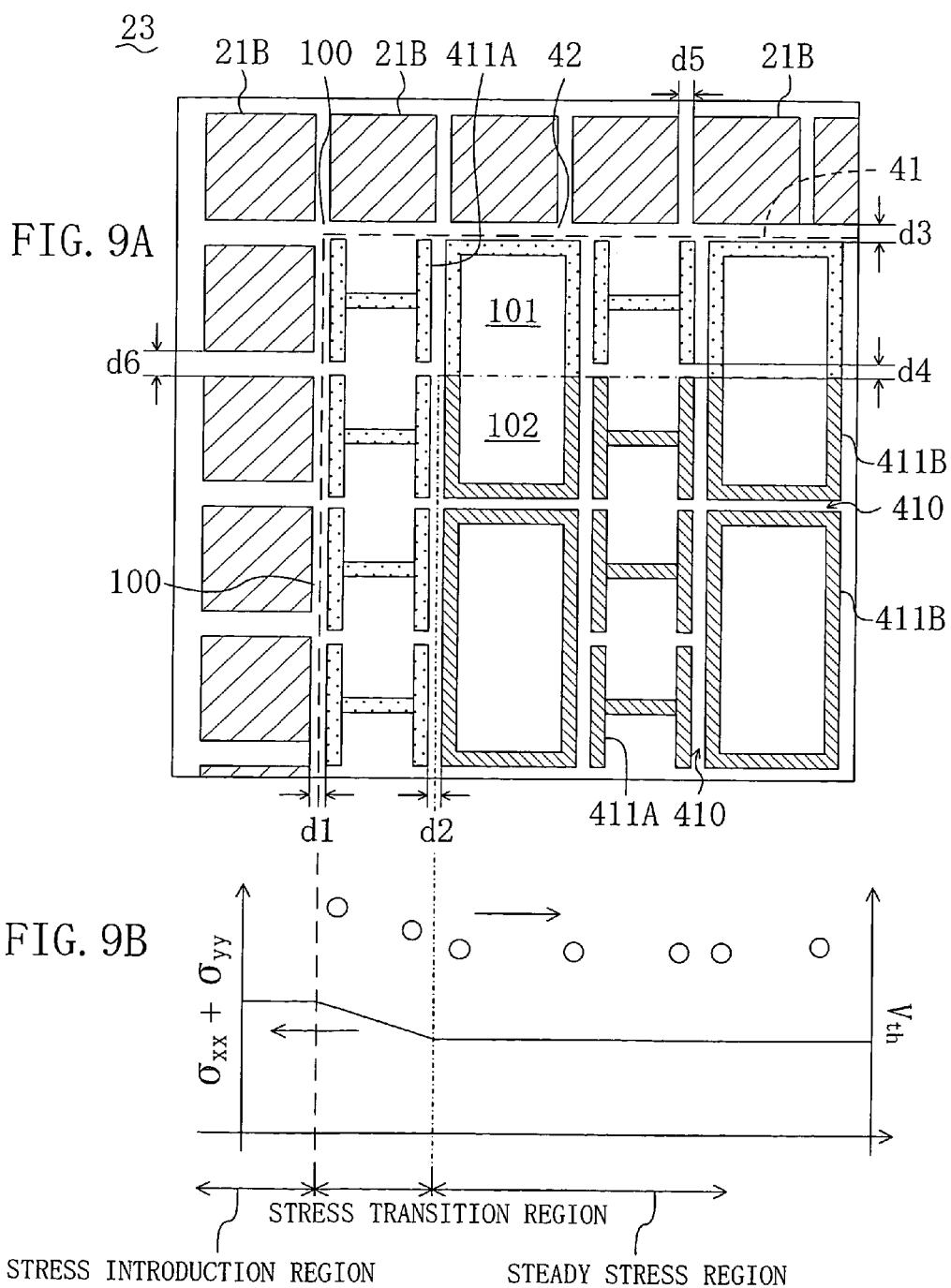
FIG. 9A is an enlarged plan view showing a portion of a semiconductor integrated circuit device according to a modification of the second embodiment of the present invention including active regions and dummy active regions.
FIG. 9B is a graph showing stress values and threshold voltages of transistors in the region of the semiconductor integrated circuit device corresponding to that shown in FIG. 9A.

FIG. 9A shows the planar configuration of a corner of an SRAM circuit in a semiconductor integrated circuit device according to a modification of the second embodiment of the present invention, and FIG. 9B shows the changes in the stress values of the active regions shown in FIG. 9A and the changes in the threshold voltages of transistors formed in the active regions receiving the stress. In FIG. 9A, the same reference numerals are given to the same components as those shown in FIG. 8A.

When the pattern shapes and arrangement of the dummy active regions 21B are changed, this varies the direction and value of compressive stress applied to each active region 411 within an SRAM circuit.

In this modification, as shown in FIG. 9A, each of the dummy active regions 21B is divided into widths, the x-width d1 and y-width d3 of an outer STI region 42 and x-distance d5 and y-distance d6 between adjacent two of the dummy active regions 21B are set at the same values as the x-width d2 and y-width d4 of an inner STI region 410, respectively. In this case, the minimum value defined by the design manual may be used as each of the dimensions d1 through d6.

In this way, according to this modification, each of the dummy active regions 21B is divided into widths equivalent to those of the active regions 411, and furthermore the distances d5 and d6 between adjacent two of the dummy active regions 21B and the widths d1 and d3 of the outer STI region 42 are set at the same dimensions as the widths d2 and d4 of the inner STI region 411. Accordingly, the ratio of total area of the patterns in the dummy active regions 21B to unit area is substantially equivalent to that of total area of the patterns in the active regions 411 to unit area. Therefore, the difference in stress applied from a stress introduction region 100 between a stress transition region 101 and a steady stress region 102 can be reduced. This surely suppresses the difference in electrical performance between a semiconductor element formed in an active region 411 within the stress transition region 101 and a semiconductor element formed in an active region 411 within the steady stress region 102.

EMBODIMENT 3

A third embodiment of the present invention will be described hereinafter with reference to the drawings.

Figure 10A:
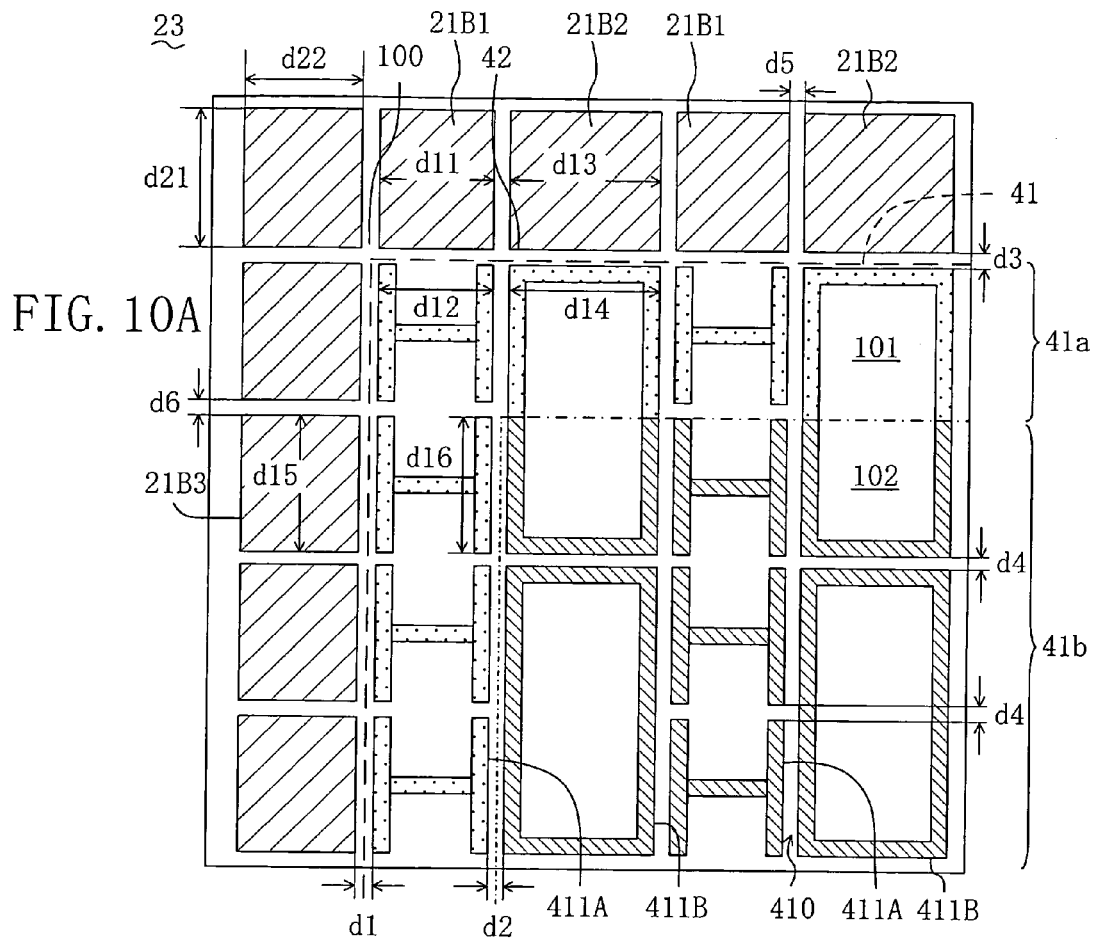
FIG. 10A is an enlarged plan view showing a portion of a semiconductor integrated circuit device according to a third embodiment of the present invention including active regions and dummy active regions.
Figure 10B:
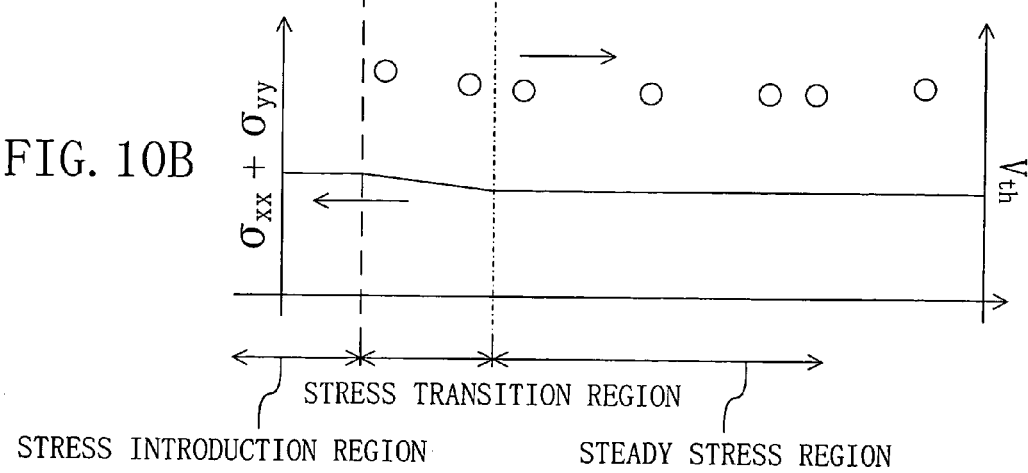
FIG. 10B is a graph showing stress values and threshold voltages of transistors in the region of the semiconductor integrated circuit device corresponding to that shown in FIG. 10A.

FIG. 10A shows the planar configuration of a corner of an SRAM circuit in a semiconductor integrated circuit device according to a third embodiment of the present invention, and FIG. 10B shows the changes in the stress values of the active regions shown in FIG. 10A and the changes in the threshold voltages of transistors formed in the active regions receiving the stress. In FIG. 10A, the same reference numerals are given to the same components as those shown in FIG. 9A.

As shown in FIG. 10A, also in the third embodiment, each of the dummy active regions 21B is divided into various widths. As in the modification of the second embodiment, the x-width d1 and y-width d3 of an outer STI region 42 and the x-distance d5 and y-distance d6 between adjacent two of the dummy active regions 21B may be set at the same values as the x-width d2 and y-width d4 of an inner STI region 410, respectively. Alternatively, each of the dimensions d1 through d6 may be set at the minimum value defined by the design manual.

In this case, the region of an SRAM circuit formation portion 41 adjacent to the dummy active regions 21B is referred to as a first element formation portion 41a, and the region of the SRAM circuit formation portion 41 located inside the first element formation portion 41a is referred to as a second element formation portion 41b. The first element formation portion 41a corresponds to the stress transition region 101, and the second element formation portion 41b corresponds to the steady stress region 102.

The third embodiment is characterized in that the x-width d11 of each of first dummy active regions 21B1 arranged in the x direction is identical with the x-width d12 of each of first active regions 411A included in the first element formation portion 41a (stress transition region 101), and the x-width d13 of each of second dummy active regions 21B2 adjacent to one of the first dummy active regions 21B1 is identical with the x-width d14 of each of second active regions 411B included in the first element formation portion 41a (stress transition region 101).

In addition, the y-width d15 of each of third dummy active regions 21B3 arranged in the y direction is identical with the y-width d16 of each of the first active regions 411A included in the first element formation portion 41a (stress transition region 101).

Specifically, when the SRAM circuit formation portion 41 is formed such that the x- and y-widths d12 and d16 of each of the first active regions 411A are 0.3 µm and 1.0 µm, respectively and the x-width d14 of each of the second active regions 411B is 0.5 µm, the x-width d11 of each of the first dummy active regions 21B1 is 0.3 µm, the x-width d13 of each of the second dummy active regions 21B2 is 0.5 µm, and the y-width d15 of each of the third dummy active regions 21B3 is 1.0 µm.

In this case, the y-width d21 of each of the first and second dummy active regions 21B1 and 21B2 and the x-width d22 of each of the third dummy active regions 21B3 each need only be 1 µm or more. The reason for this is that stress insignificantly affects the active regions 411A and 411B located 1 µm or more away from the outer STI region 42.

When any of the y-widths of the first and second dummy active regions 21B1 and 21B2 and the x-width of the third dummy active region 21B3 is set at 1 µm or less, that dummy active region can be formed to have an entire width of 1 µm or more to obtain the same effects.

According to the third embodiment, the width of each of the dummy active regions 21B1, 21B2 and 21B3 is set at the same value as the width of the adjacent active region 411A or 411B included in the first element formation portion 41a, and furthermore the width of the outer STI region 42 that is the stress introduction region 100 is also set at the same value as the width of the inner STI region 410. Thus, as compared with the second embodiment and its modification, the state of compressive stress applied to each of the active regions 411A and 411B located at the end of the SRAM circuit formation portion 41 is brought closer to the state of compressive stress applied to the central portion of the SRAM circuit formation portion 41.

In this way, a rule for forming dummy active regions 21B is changed, thereby reducing the difference in stress between the stress transition region 101 and the steady stress region 102. This can suppress the difference in electrical performance between a semiconductor element formed in the stress transition region 101 and a semiconductor element formed in the steady stress region 102.

EMBODIMENT 4

A fourth embodiment of the present invention will be described hereinafter with reference to the drawings.

Figure 11A:
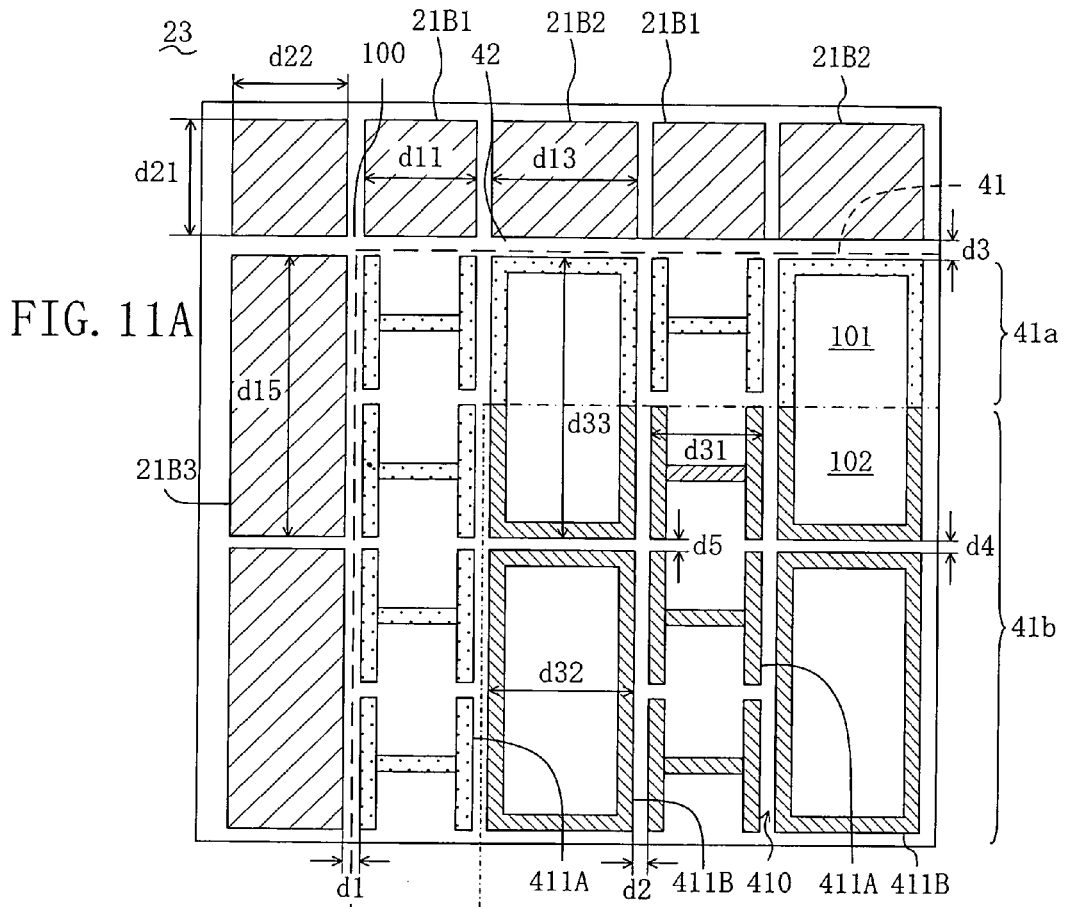
FIG. 11A is an enlarged plan view showing a portion of a semiconductor integrated circuit device according to a fourth embodiment of the present invention including active regions and dummy active regions.
Figure 11B:
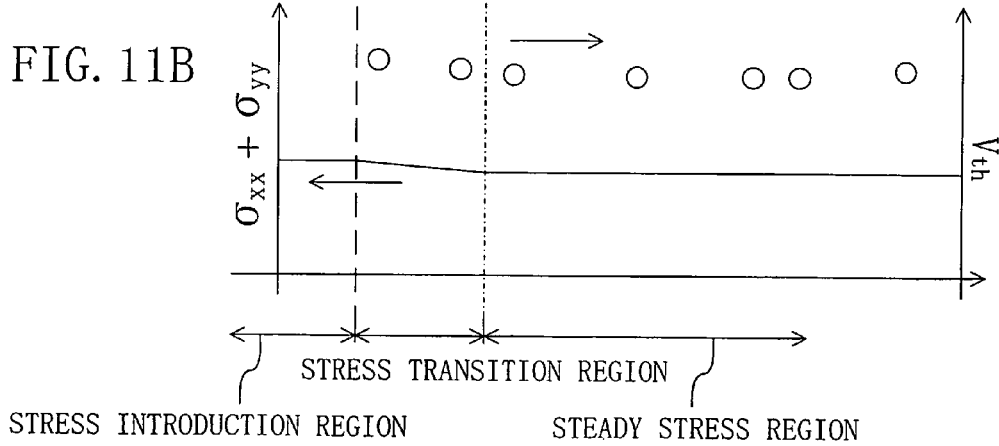
FIG. 11B is a graph showing stress values and threshold voltages of transistors in the region of the semiconductor integrated circuit device corresponding to that shown in FIG. 11A.
Figures 12A, 12B:
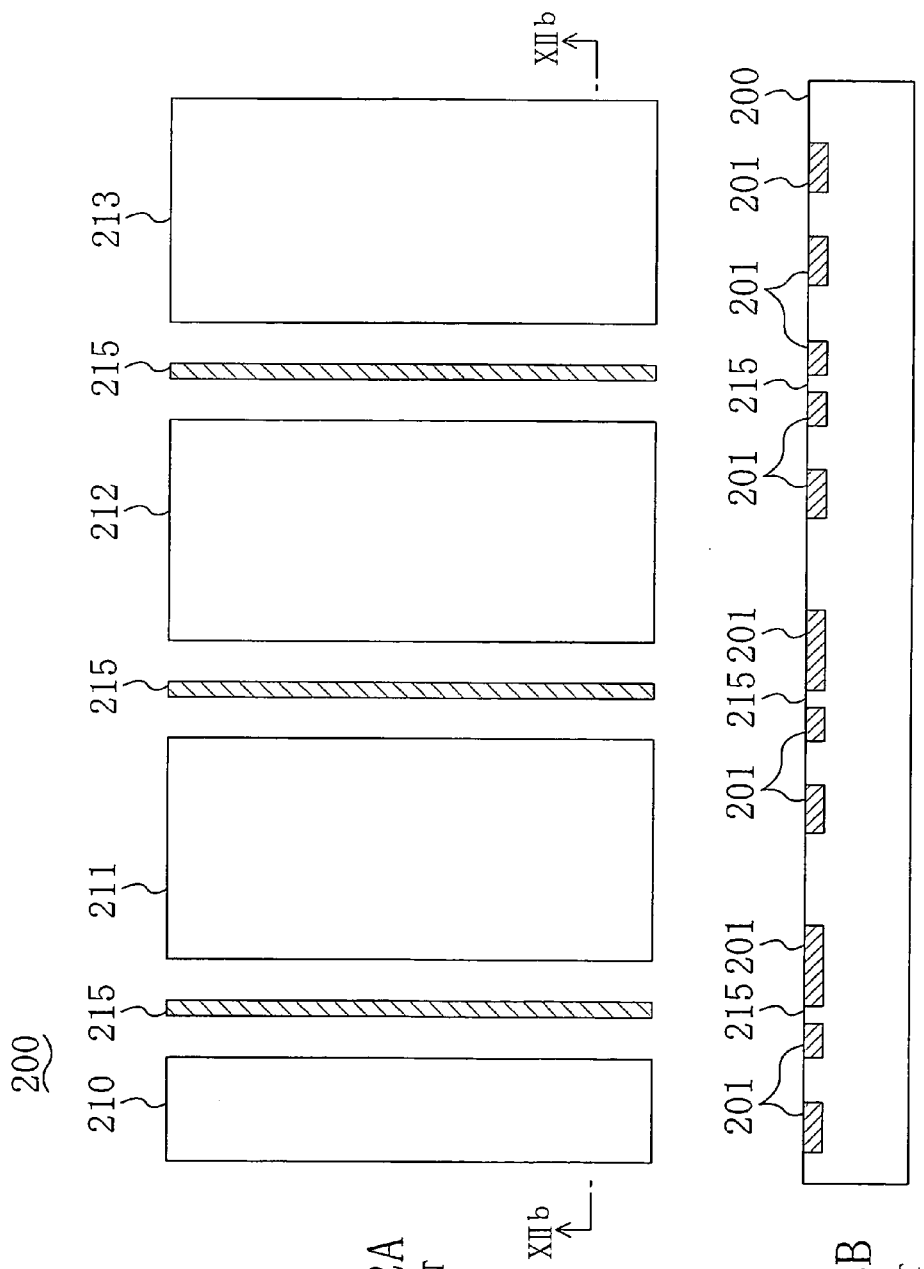

FIG. 11A shows the planar configuration of a corner of an SRAM circuit in a semiconductor integrated circuit device according to a fourth embodiment of the present invention, and FIG. 11B shows the changes in the stress values of the active regions shown in FIG. 11A and the changes in the threshold voltages of transistors formed in the active regions receiving the stress. In FIG. 11A, the same reference numerals are given to the same components as those shown in FIG. 10A.

As shown in FIG. 11A, in the fourth embodiment, each of the dummy active regions 21B is divided into various widths. The x-width d1 of an outer STI region 100 is set to be identical with the x-width d2 of an inner STI region 410 located in a second element formation portion 41b (steady stress region 102), and the y-width d3 of the outer STI region 100 is set at the same value as the y-widths d4 and d5 of the inner STI region 410 located in the second element formation portion 41b (steady stress region 102). Alternatively, each of the dimensions d1 through d5 may be set at the minimum value defined by the design manual.

The fourth embodiment is characterized in that the x-width d11 of each of first dummy active regions 21B1 arranged in the x direction is identical with the x-width d31 of each of first active regions 411A included in the second element formation portion 41b (steady stress region 102), and the x-width d13 of each of second dummy active regions 21B2 adjacent to one of the first dummy active regions 21B1 is identical with the x-width d32 of each of second active regions 411B included in the second element formation portion 41b (steady stress region 102).

In addition, the y-width d15 of each of third dummy active regions 21B3 arranged in the y direction is identical with the y-width d33 of each of the second active regions 411B included in the second element formation portion 41b (steady stress region 102).

In this way, in the fourth embodiment, the x- and y-widths of each dummy active region 21B1, 21B2 or 21B3 are determined so that the planar shapes of the dummy active regions 21B1, 21B2 and 21B3 obtained by dividing each of the dummy active regions 21B correspond to repetitive patterns of the active regions 411A and 411B formed in the SRAM circuit formation portion 41.

To be specific, when the SRAM circuit formation portion 41 is formed such that the x-width d31 of each of the first active regions 411A is 0.3 µm, the x-width d32 of each of the second active regions 411B is 0.5 µm and the y-width d33 thereof is 1.5 µm, the x-width d11 of each of the first dummy active regions 21B1 is 0.31 µm, the x-width d13 of each of the second dummy active regions 21B2 is 0.5 µm, and the y-width d15 of each of the third dummy active regions 21B3 is 1.5 µm.

In this case, the y-width d21 of each of the first and second dummy active regions 21B1 and 21B2 and the x-width d22 of each of the third dummy active regions 21B3 each need only be 1 µm or more. The reason for this is that stress insignificantly affects the active regions 411A and 411B 1 µm or more away from the outer STI region.

When any of the y-widths of the first and second dummy active regions 21B1 and 21B2 and the x-width of the third dummy active region 21B3 is set at 1 µm or less, that dummy active region can be formed to have an entire width of 1 μm or more to obtain the same effects.

As described above, in the fourth embodiment, the plane dimensions of each dummy active region 21B1, 21B2 or 21B3 and the outer STI region 42 are allowed to correspond to repetitive patterns of the first active regions 411A and the second active regions 411B in the SRAM circuit formation portion 41.

Therefore, the dummy active regions 21B1, 21B2 and 21B3 are formed without disturbing the repetitive patterns of the active regions 411A and 411B, so that the difference in stress applied to the active regions 411A and 411B between the stress transition region 101 and the steady stress region 102 is further reduced. Therefore, the difference in electrical performance between a semiconductor element formed in the stress transition region 101 and a semiconductor element formed in the steady stress regions 102 can be further suppressed.

What is claimed is:

1. A semiconductor integrated circuit device comprising:
   an outer isolation region isolating a function block from another; and
   an inner isolation region isolating a plurality of devices from one another in the function block,
   wherein the plurality of devices are formed on an outer active region and an inner active region,
   the outer active region is formed adjacent to the outer isolation region,
   the inner active region is formed apart from the outer isolation region, with the outer active region interposed therebetween,
   only the plurality of the devices of the inner active region are electrically driven, and
   one element of the outer active region has the same plane dimensions as one element of the inner active region.

2. The semiconductor integrated circuit device of claim 1, wherein
   the outer active region has a stress resulting from a material constituting the outer isolation region, the stress varying depending on the distance between the outer active region and the outer isolation region, and
   the inner active region has a stress resulting from a material constituting the outer isolation region, the stress being constant regardless of the distance between the inner active region and the outer isolation region.

3. The semiconductor integrated circuit device of claim 1, wherein the outer isolation region has the same width as that of the inner isolation region.

4. The semiconductor integrated circuit device of claim 1, wherein
   the inner and outer isolation regions have the minimum dimension of the design rule.

5. The semiconductor integrated circuit device of claim 1, further comprising:
   a dummy active region formed adjacent to the outer active region with the outer isolation region interposed therebetween,
   wherein
   one element of the dummy active region has the same plane dimensions as one element of the outer active region.

6. The semiconductor integrated circuit device of claim 1, wherein the ratio of total area of element patterns in the dummy regions to unit area is identical with that of total area of element patterns in the active regions to unit area.

7. The semiconductor integrated circuit device of claim 1, wherein
   the outer isolation region has the same width as that of the inner isolation region.

8. The semiconductor integrated circuit device of claim 1, wherein
   the outer and inner active regions have at least two kinds of different planar shapes, and said at least two kinds of different planar shapes are placed one after another in a predetermined cycle.

9. The semiconductor integrated circuit device of claim 1, wherein
   the outer isolation region has a larger width than that of the inner isolation region.

10. The semiconductor integrated circuit device of claim 5, wherein the outer and inner active regions have at least two kinds of different planar shapes, said at least two kinds of different planar shapes are placed one after another in a predetermined cycle.

* * * * *